US00RE46618E

(19) United States
(12) Reissued Patent
Lange et al.

(10) Patent Number: US RE46,618 E
(45) Date of Reissued Patent: *Nov. 28, 2017

(54) METHOD FOR FABRICATING LOW RESISTANCE, LOW INDUCTANCE INTERCONNECTIONS IN HIGH CURRENT SEMICONDUCTOR DEVICES

(71) Applicant: TEXAS INSTRUMENTS INCORPORATED, Dallas, TX (US)

(72) Inventors: Bernhard P. Lange, Freising (DE); Anthony L. Coyle, Parker, TX (US); Quang X. Mai, Sugar Land, TX (US)

(73) Assignee: TEXAS INSTRUMENTS INCORPORATED, Dallas, TX (US)

( * ) Notice: This patent is subject to a terminal disclaimer.

(21) Appl. No.: 13/870,579

(22) Filed: Aug. 20, 2013

Related U.S. Patent Documents

Reissue of:
(64) Patent No.: 7,335,536
Issued: Feb. 26, 2008
Appl. No.: 11/218,408
Filed: Sep. 1, 2005

U.S. Applications:
(62) Division of application No. 12/712,934, filed on Feb. 25, 2010, now Pat. No. Re. 46,466, which is an application for the reissue of Pat. No. 7,335,536.

(51) Int. Cl.
*H01L 21/00* (2006.01)
*H01L 21/82* (2006.01)
(Continued)

(52) U.S. Cl.
CPC ..... *H01L 23/53238* (2013.01); *H01L 23/528* (2013.01); *H01L 24/05* (2013.01);
(Continued)

(58) Field of Classification Search
CPC ..... H01L 24/11; H01L 23/53238; H01L 24/13
(Continued)

(56) References Cited

U.S. PATENT DOCUMENTS 5,083,187 A 1/1992 Lamson et al.
6,049,130 A 4/2000 Hosomi et al.
(Continued)

FOREIGN PATENT DOCUMENTS

JP EP 0061863 A1 * 10/1982 ..... H01L 21/4825
WO WO2007024587 3/2007
WO WO2007027994 3/2007

OTHER PUBLICATIONS

"Detailed Structural Analysis I of the Intel Pentium 3.0E GHz Processor Prescott," Seminconductor Insights Inc., Mar. 2004, pp. 1-26.
(Continued)

*Primary Examiner* — Anjan K Deb
(74) *Attorney, Agent, or Firm* — Levis H. Perry; Charles A. Brill; Frank D. Cimino

(57) ABSTRACT

A method for fabricating a low resistance, low inductance device for high current semiconductor flip-chip products. A structure is produced, which comprises a semiconductor chip with metallization traces, copper lines in contact with the traces, and copper bumps located in an orderly and repetitive arrangement on each line so that the bumps of one line are positioned about midway between the corresponding bumps of the neighboring lines. A substrate is provided which has elongated copper leads with first and second surfaces, the leads oriented at right angles to the lines. The first surface of each lead is connected to the corresponding bumps of alternating lines using solder elements. Finally, the assembly is encapsulated in molding compound so that the second lead surfaces remain un-encapsulated.

16 Claims, 8 Drawing Sheets

(51) Int. Cl.

| | |
|---|---|
| ***H01L 21/44*** | (2006.01) |
| ***H01L 23/532*** | (2006.01) |
| ***H01L 23/00*** | (2006.01) |
| ***H01L 23/528*** | (2006.01) |
| *H01L 23/31* | (2006.01) |

(52) U.S. Cl.

CPC ..... *H01L 24/11* (2013.01); *H01L 24/13* (2013.01); *H01L 24/14* (2013.01); *H01L 23/3121* (2013.01); *H01L 23/3192* (2013.01); *H01L 24/03* (2013.01); *H01L 24/16* (2013.01); *H01L 24/81* (2013.01); *H01L 24/94* (2013.01); *H01L 2224/0235* (2013.01); *H01L 2224/0239* (2013.01); *H01L 2224/02311* (2013.01); *H01L 2224/02313* (2013.01); *H01L 2224/02331* (2013.01); *H01L 2224/02375* (2013.01); *H01L 2224/0345* (2013.01); *H01L 2224/0361* (2013.01); *H01L 2224/03912* (2013.01); *H01L 2224/0401* (2013.01); *H01L 2224/05024* (2013.01); *H01L 2224/05073* (2013.01); *H01L 2224/05166* (2013.01); *H01L 2224/05647* (2013.01); *H01L 2224/1147* (2013.01); *H01L 2224/11462* (2013.01); *H01L 2224/11912* (2013.01); *H01L 2224/13013* (2013.01); *H01L 2224/13082* (2013.01); *H01L 2224/13099* (2013.01); *H01L 2224/13111* (2013.01); *H01L 2224/13144* (2013.01); *H01L 2224/13147* (2013.01); *H01L 2224/13155* (2013.01); *H01L 2224/13164* (2013.01); *H01L 2224/14133* (2013.01); *H01L 2224/16225* (2013.01); *H01L 2224/16245* (2013.01); *H01L 2224/8146* (2013.01); *H01L 2224/81191* (2013.01); *H01L 2224/81424* (2013.01); *H01L 2224/81447* (2013.01); *H01L 2224/81815* (2013.01); *H01L 2224/94* (2013.01); *H01L 2924/014* (2013.01); *H01L 2924/01006* (2013.01); *H01L 2924/01013* (2013.01); *H01L 2924/01022* (2013.01); *H01L 2924/01029* (2013.01); *H01L 2924/01032* (2013.01); *H01L 2924/01033* (2013.01); *H01L 2924/01046* (2013.01); *H01L 2924/01047* (2013.01); *H01L 2924/01074* (2013.01); *H01L 2924/01078* (2013.01); *H01L 2924/01079* (2013.01); *H01L 2924/01082* (2013.01); *H01L 2924/10329* (2013.01); *H01L 2924/14* (2013.01); *H01L 2924/181* (2013.01); *H01L 2924/19043* (2013.01); *H01L 2924/30107* (2013.01); *H01L 2924/3841* (2013.01)

(58) Field of Classification Search

USPC ..... 438/109, 129, 666, 599

See application file for complete search history.

(56) References Cited

U.S. PATENT DOCUMENTS

| | | | | |
|---|---|---|---|---|
| 6,169,329 | B1 | 1/2001 | Farnworth et al. | |
| 6,297,460 | B1 * | 10/2001 | Schaper | 174/261 |
| 6,388,200 | B2 * | 5/2002 | Schaper | 174/255 |
| 6,407,462 | B1 * | 6/2002 | Banouvong et al. | 257/787 |
| 6,489,688 | B1 * | 12/2002 | Baumann et al. | 257/786 |
| 6,510,976 | B2 | 1/2003 | Hwee et al. | |
| 6,550,666 | B2 | 4/2003 | Chew et al. | |
| 6,686,666 | B2 * | 2/2004 | Bodas | 257/786 |
| 6,759,738 | B1 | 7/2004 | Fallon et al. | |
| 6,762,507 | B2 * | 7/2004 | Cheng et al. | 257/786 |
| 6,768,210 | B2 | 7/2004 | Zuniga-Ortiz et al. | |
| 6,790,758 | B2 | 9/2004 | Hsieh et al. | |
| 6,798,075 | B2 * | 9/2004 | Liaw et al. | 257/784 |
| 6,977,435 | B2 | 12/2005 | Kim et al. | |
| 7,049,642 | B2 * | 5/2006 | Shinjo | G11C 5/025 257/203 |
| 7,122,897 | B2 | 10/2006 | Aiba et al. | |
| 7,127,807 | B2 * | 10/2006 | Yamaguchi | H01L 23/5387 156/297 |
| 7,465,654 | B2 * | 12/2008 | Chou | H01L 23/53238 257/E21.476 |
| 8,039,956 | B2 | 10/2011 | Coyle et al. | |
| 2004/0007779 | A1 * | 1/2004 | Arbuthnot | H01L 24/11 257/780 |
| 2004/0089946 | A1 | 5/2004 | Wen | |
| 2004/0201101 | A1 | 10/2004 | Kang et al. | |
| 2005/0167826 | A1 | 8/2005 | Zuniga-Ortiz et al. | |
| 2007/0040237 | A1 | 2/2007 | Coyle et al. | |
| 2007/0130554 | A1 * | 6/2007 | Caruba | 716/11 |

OTHER PUBLICATIONS

"Intel Prescott Package, Die Connection Layer," UBM TechInsights, Aug. 4, 2011, pp. 1-5.

"Intel BX80545PG2800E Pentium® 4 Prescoit Microprocessor Structural Analysis," Inside Technology, Chipworks, Apr. 1, 2005, www.chipworks.com, pp. 1-8.

PCT Search Report dated Mar. 26, 2008.

PCT/US2006/031933 Search Report (WO2007024587).

"Multichip Assembly With Flipped Integrated Circuits," IEEE Transactions on Components, Hybrids and Manufacturing Technology, vol. 12, No. 4, Dec. 1989 (Heinen, et al.).

File History U.S. Appl. No. 11/210,066.

File History U.S. Appl. No. 11/210,066 (Part 1).

File History U.S. Appl. No. 11/210,066 (Part 2).

File History U.S. Appl. No. 11/210,066 (Part 3).

File History U.S. Appl. No. 11/210,066 (Part 4).

File History U.S. Appl. No. 11/210,066 (Part 5).

File History U.S. Appl. No. 11/210,066 (Part 6).

File History U.S. Appl. No. 11/210,066 (Part 7).

File History U.S. Appl. No. 11/210,066 (Part 8).

File History WO2007027994.

File History WO2007024587.

* cited by examiner

METHOD FOR FABRICATING LOW RESISTANCE, LOW INDUCTANCE INTERCONNECTIONS IN HIGH CURRENT SEMICONDUCTOR DEVICES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*RELATED APPLICATIONS*

*This Application is a Divisional Reissue of Reissue application Ser. No. 12/712,934, filed on Feb. 25, 2010, now U.S. Re. No. 46,466, which is an application for reissue of U.S. Pat. No. 7,335,536, Ser. No. 11/218,408; moreover, more than one reissue patent application has been filed for the reissue of U.S. Pat. No. 7,335,536, which include Reissue application Ser. No. 12/712,934, filed on Feb. 25, 2010, now U.S. Re. No. 46,466 which is the parent reissue application from which the present Divisional Reissue Application claims priority, and through which the present Divisional Reissue Application claims priority to U.S. Pat. No. 7,335,536; and also included is Continuation Reissue application Ser. No. 14/023,281, filed on Sep. 10, 2013, which is a continuation reissue of Reissue Application Ser. No. 12/712,934 and which likewise claims priority to Reissue application Ser. No. 12/712,934 and U.S. Pat. No. 7,335,536.*

*PRIORITY/RELATED APPLICATIONS*

*This Application is a Divisional of TI-60909RE, which is a Reissue of U.S. Pat. No. 7,335,536, Ser. No. 11/218,408.*

FIELD OF THE INVENTION

The present invention is related in general to the field of semiconductor devices and processes and more specifically to a fabrication method of high performance flip-chip semiconductor devices, which have low electrical resistance and can provide high power, low noise, and high speed.

DESCRIPTION OF THE RELATED ART

Among the ongoing trends in integrated circuit (IC) technology are the drives towards higher integration, shrinking component feature sizes, and higher speed. In addition, there is the relentless pressure to keep the cost/performance ratio under control, which translates often into the drive for lower cost solutions. Higher levels of integration include the need for higher numbers of signal lines and power lines, yet smaller feature sizes make it more and more difficult to preserve clean signals without mutual interference.

These trends and requirements do not only dominate the semiconductor chips, which incorporate the ICs, but also the packages, which house and protect the IC chips.

Compared to the traditional wire bonding assembly, the growing popularity of flip-chip assembly in the fabrication process flow of silicon integrated circuit (IC) devices is driven by several facts. First, the electrical performance of the semiconductor devices can commonly be improved when the parasitic inductances correlated with conventional wire bonding interconnection techniques are reduced. Second, flip-chip assembly often provides higher interconnection densities between chip and package than wire bonding. Third, in many designs flip-chip assembly consumes less silicon "real estate" than wire bonding, and thus helps to conserve silicon area and reduce device cost. And fourth, the fabrication cost can often be reduced, when concurrent gang-bonding techniques are employed rather than consecutive individual bonding steps.

The standard method of ball bonding in the fabrication process uses solder balls and their reflow technique. These interconnection approaches are more expensive than wire bonding. In addition, there are severe reliability problems in some stress and life tests of solder ball attached devices. Product managers demand the higher performance of flip-chip assembled products, but they also demand the lower cost and higher reliability of wire bonded devices. Furthermore, the higher performance of flip-chip assembled products should be continued even in miniaturized devices, which at present run into severe technical difficulties by using conventional solder ball technologies.

SUMMARY OF THE INVENTION

Applicants recognize a need to develop a technical approach which considers the complete system consisting of semiconductor chip—device package—external board, in order to provide superior product characteristics, including low electrical resistance and inductance, high reliability, and low cost. Minimum inductance and noise is the prerequisite of high speed, and reduced resistance is the prerequisite of high power. The system-wide method of assembling should also provide mechanical stability and high product reliability, especially in accelerated stress tests (temperature cycling, drop test, etc.). The fabrication method should be flexible enough to be applied for semiconductor product families with shrinking geometries, including substrates and boards, and a wide spectrum of design and process variations.

One embodiment of the invention is a method for fabricating a low resistance, low inductance interconnection structure for high current semiconductor flip-chip products. A semiconductor wafer is provided, which has metallization traces, the wafer surface protected by an overcoat, and windows in the overcoat to expose portions of the metallization traces. Copper lines are formed on the overcoat, preferably by electroplating; the lines are in contact with the traces by filling the windows with metal. Next a layer of photo-imageable insulation material is deposited over the lines and the remaining wafer surface. Windows are opened in the insulation material to expose portions of the lines, the locations of the windows selected in an orderly and repetitive arrangement on each line so that the windows of one line are positioned about midway between the corresponding windows of the neighboring lines. Copper bumps are formed, preferably by electroplating, in the windows, and are in contact with the lines.

Certain device features serve multiple purposes in the process flow. The photo-imageable insulation layer doubles as protection against running solder in the assembly process. The photoresist layers needed to enable the electroplating steps double as thickness controls for the copper elements being electroplated.

Another embodiment of the invention is a method for fabricating a low resistance, low inductance device for high current semiconductor flip-chip products. A structure is provided, which comprises a semiconductor chip with metallization traces, copper lines in contact with the traces, and copper bumps located in an orderly and repetitive arrangement on each line so that the bumps of one line are positioned about midway between the corresponding bumps of the neighboring lines. Further, a substrate is provided which has elongated copper leads with first and second surfaces, the leads oriented at right angles to the lines. The first surface of each lead is connected to the corresponding bumps of alternating lines using solder elements. Finally, the assembly is encapsulated in molding compound so that the second lead surfaces remain un-encapsulated.

Another embodiment of the invention is a method for fabricating a low resistance, low inductance interconnection system for high current semiconductor flip-chip devices. An encapsulated device as described above is provided, with lead surfaces un-encapsulated. Further a circuit board is provided, which has copper contact pads parallel to the leads. The device lead surfaces are attached to the board pads using solder layers.

The technical advantages represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 1A through 15 illustrate a plurality of process steps in the fabrication method of low resistance, low inductance interconnections for high current semiconductor devices.

FIG. 1A is a schematic cross section of a portion of a semiconductor wafer depicting the opening of a window in the wafer overcoat to expose a portion of a metallization trace.

FIG. 2 is a schematic cross section of the wafer portion of FIG. 1 to depict the deposition of a barrier layer and a seed layer.

FIG. 3 is a schematic cross section of the wafer portion of FIG. 2 to depict the deposition and exposure of a first photoresist layer over the seed layer.

FIG. 4 is a schematic cross section of the wafer portion of FIG. 3 to depict the opening of a window in the first photoresist layer to expose a portion of the seed layer.

FIG. 5 is a schematic cross section of the wafer portion of FIG. 4 to depict the deposition of a copper line to the height of the first photoresist layer.

FIG. 7 is a schematic cross section of the wafer portion of FIG. 6A to depict the deposition and exposure of a layer of photo-imageable insulation material over the wafer surface.

FIG. 9 is a schematic cross section of the wafer portion of FIG. 8A to depict the deposition of a barrier layer and a seed layer.

FIG. 10 is a schematic cross section of the wafer portion of FIG. 9 to depict the deposition and exposure of a second photoresist layer over the seed layer.

FIG. 11 is a schematic cross section of the wafer portion of FIG. 10 to depict the opening of the second photoresist layer to expose a portion of the seed layer.

FIG. 12 is a schematic cross section of the wafer portion of FIG. 11 to depict the deposition of a copper bump and solderable layers to the height of the second photoresist layer.

FIG. 15 is a schematic cross section of the flipped assembly of FIG. 14B to illustrate the encapsulation of the assembly in molding compound.

DETAILED DESCRIPTION OF THE PREFERRED EMBODIMENTS

The present invention is related to U.S. patent application Ser. No. 11/210,066, filed on Aug. 22, 2005. (Coyle et al., "High Current Semiconductor Device System having Low Resistance and Inductance"; TI-60885).

Figure 1A:
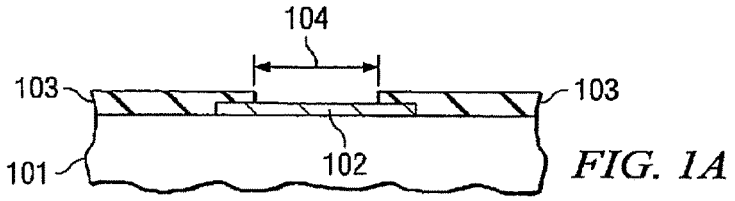

FIGS. 1A through 15 illustrate certain process steps in the fabrication method of low electrical resistance, low inductance interconnections, which are suitable for high current semiconductor devices and systems. FIG. 1A shows a portion of a semiconductor wafer 101, which has a metallization trace 102 and is protected by an overcoat layer 103. For many devices, the semiconductor wafer is silicon or silicon germanium, but for other devices the wafer may be gallium arsenide or any other compound used in semiconductor product manufacture. The metallization trace for many devices is aluminum or an aluminum alloy, for other devices it is copper or a copper alloy; the thickness range is typically 0.5 to 1 μm. In many devices, the metallization level of trace 102 is the top level out of several metallization levels of the device. The overcoat is frequently silicon nitride or silicon oxynitride, in the thickness range from about 0.7 to 1.2 μm; in some devices the overcoat is a stack of layers such as silicon dioxide over the semiconductor and silicon nitride of oxynitride as the outermost layer. The thickness of the stack is often between 0.7 and 1.5 μm.

Figure 1B:
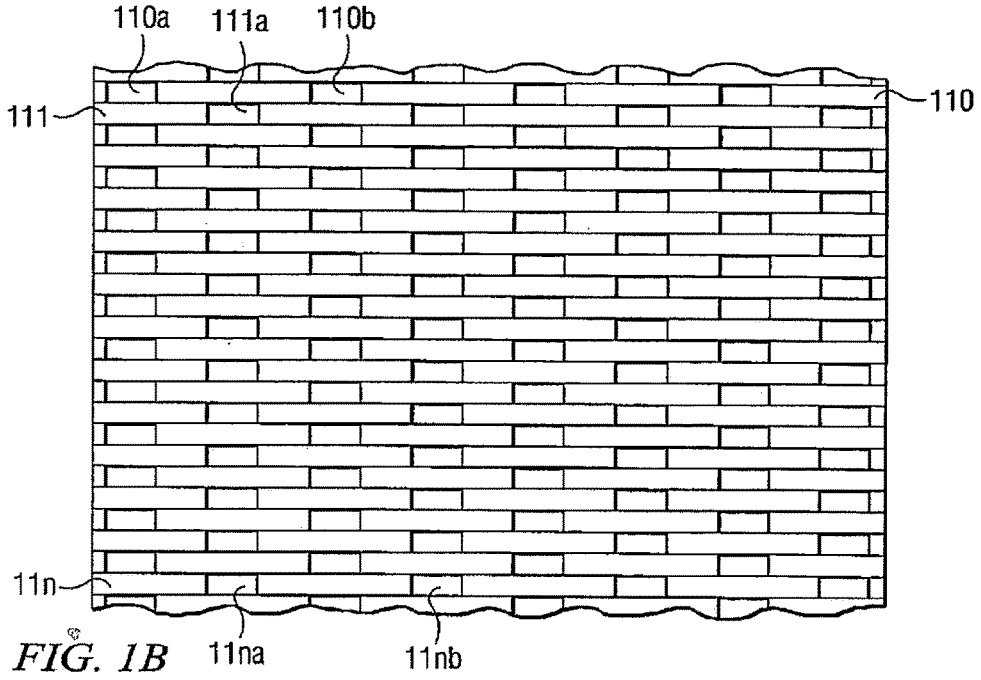
FIG. 1B is a schematic top view of patterned metallization traces as an example to illustrate the number and location of the windows selected to be opened as shown in FIG. 1A.
Figure 1C:
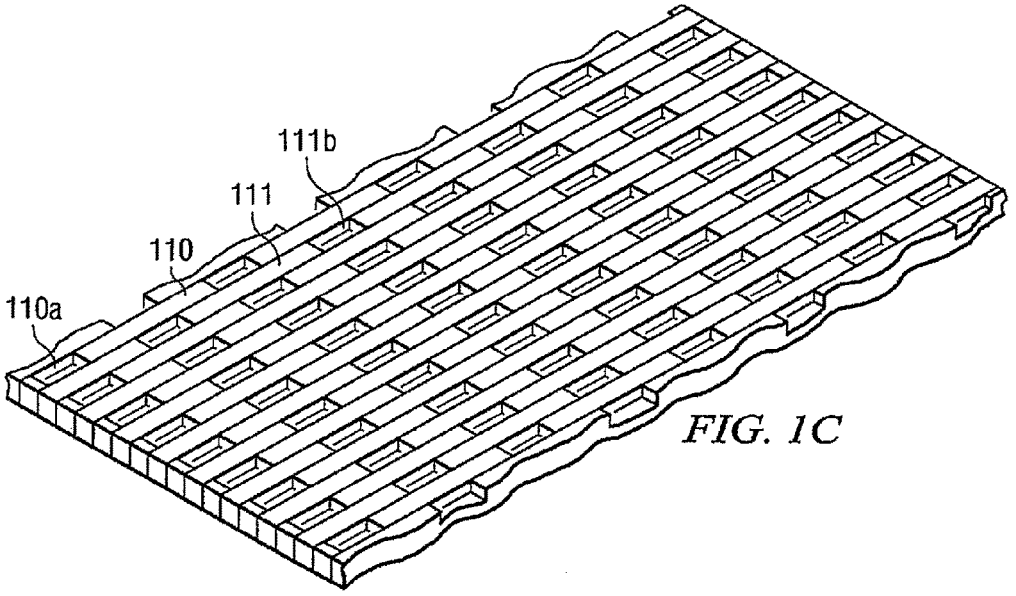
FIG. 1C is a schematic perspective view of patterned metallization traces as an example to illustrate the number and location of the windows selected to be opened as shown in FIG. 1A.

A window of width 104 is opened in overcoat 103 to expose a portion of metallization trace 102. The top view of FIG. 1B gives an example of parallel metallization traces 110, 111, . . . , 11n of a device together with the number and distribution of the overcoat openings 110a, 110b, . . . , 11na, 11nb, . . . to expose the metallization traces. FIG. 1C repeats the metallization traces of FIG. 1B in perspective view.

Figure 2:
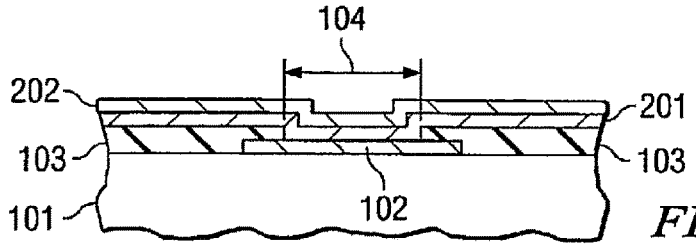

As FIG. 2 indicates, a couple of metal layers 201 and 202 are deposited over the wafer surface, including window 104; the preferred method of deposition is a sputtering technique. Layer 201 is a barrier metal such as titanium/tungsten alloy of approximately 0.5 μm thickness or less. Layer 202 is a seed metal layer, preferably copper, in the thickness range of about 0.5 to 0.8 μm. The stack of layers 201 and 202 is suitable to provide uniform potential for an electroplating step.

Figure 3:
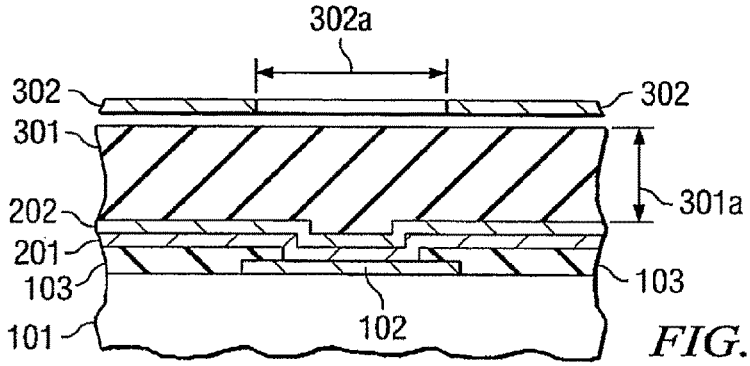

In FIG. 3, a first photoresist layer 301 is deposited over seed metal layer 202 of the wafer. The thickness 301a of the photoresist layer 301 is selected so that it is commensurate with the intended height of the copper lines, which will be fabricated using photoresist layer 301. FIG. 3 further indicates the photomask 302 with the opening 302a for defining the copper line width by exposing the wafer under the mask.

Figure 4:
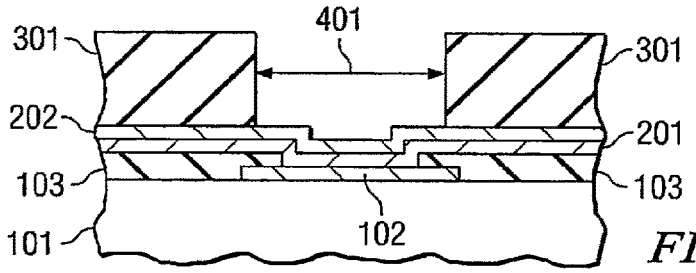
Figure 5:
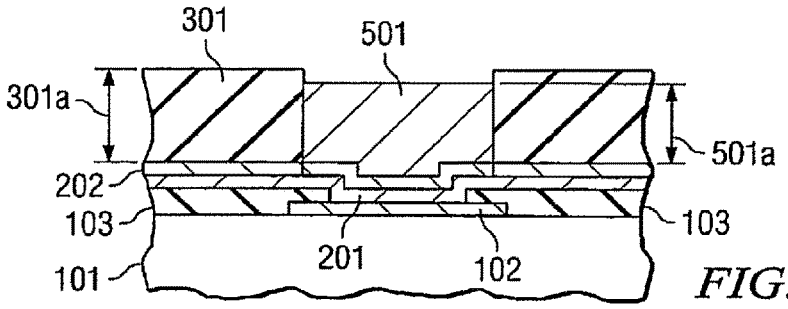

FIG. 4 illustrates the exposed and developed photoresist layer 301. A plurality of windows 401 is opened in first photoresist layer 301, exposing a portion of seed layer 202. FIG. 5 shows the next process step, the deposition of copper 501 in the window. Preferably using electroplating, copper or copper alloy is deposited in the photoresist window to fill the window to the thickness 301a of the photoresist, creating copper lines 501 of height 501a. Alternatively, other conducting materials, preferably of high electrical conductivity, may be deposited; examples are silver or silver alloys, or carbon nano-tubes.

Figure 6A:
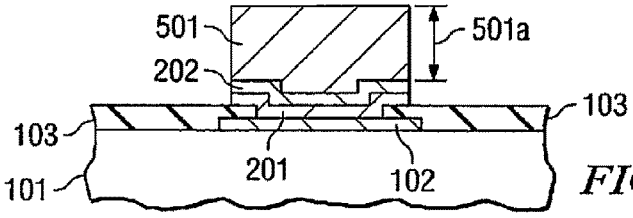
FIG. 6A is a schematic cross section of the wafer portion of FIG. 5 to depict the removal of the first photoresist layer, the barrier layer, and the seed layer.
Figure 6B:
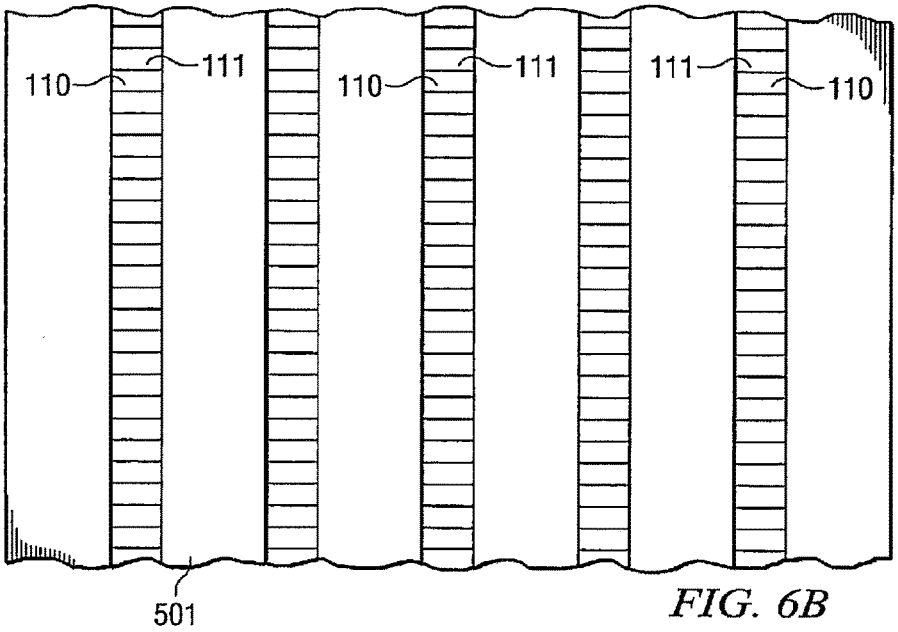
FIG. 6B is a schematic top view of the portion of patterned metallization traces of FIG. 1B as an example to illustrate the number and location of the copper lines.
Figure 6C:
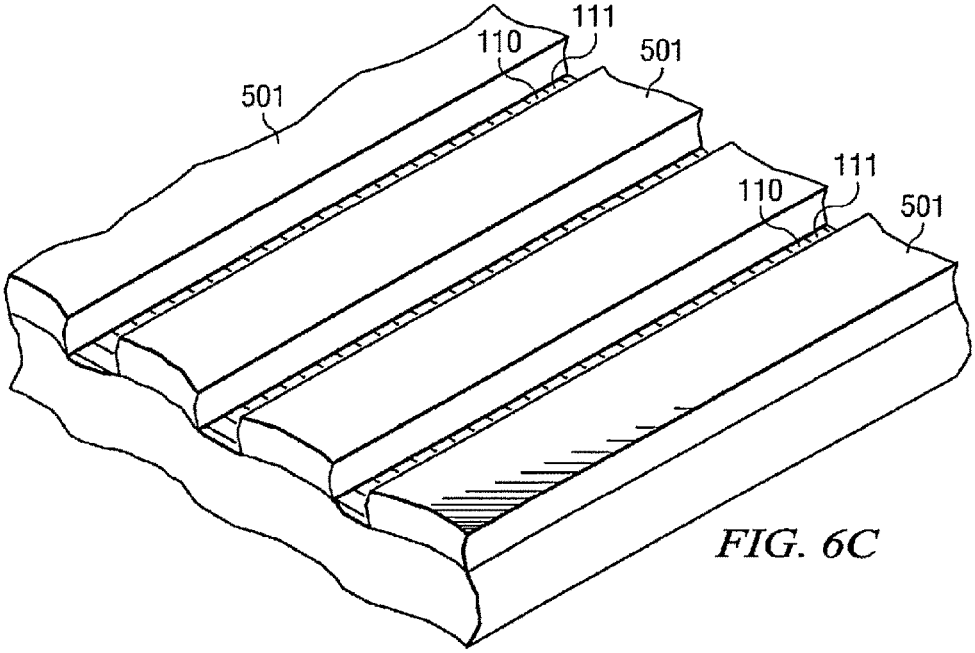
FIG. 6C is a schematic perspective view of the portion of patterned metallization traces of FIG. 1C as an example to illustrate the number and location of the copper lines.

In the next process steps shown in FIG. 6A, the first photoresist layer is removed. Using the plated copper structure 501 as an etch mask, the barrier (or adhesion) metal layer 201 and the seed metal layer 202 are subsequently etched off outside of copper line 501. A portion of the plurality of the plated copper lines is shown in the top view of FIG. 6B and in the perspective view of FIG. 6C. In the examples of these figures, the copper lines are depicted to be at right angles to wafer metallization traces 110 and 111. As stated earlier, in other devices, copper lines 501 may be parallel to the metallization traces, or at any other angle.

Figure 7:
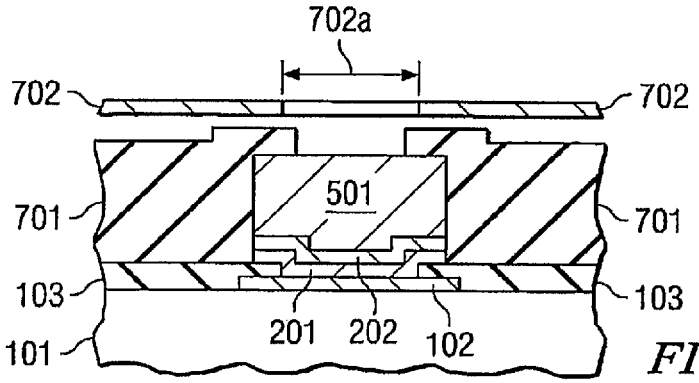

In FIG. 7, the wafer is coated with a photo-imageable insulation material 701 such as polyimide, preferably using a spin-on technique. With this technique, geometrical surface steps or irregularities are smoothened, including the step caused by the copper lines 501, as schematically indicated in FIG. 7. The insulator thickness is between approximately 10 and 20 μm. A relatively thinner insulator layer is formed on the copper line surface. The main function of the insulation material becomes operable in the later assembly step of reflowing solder elements for attachment; the insulation material prevents an accidental electrical shortening of nearby conductors.

FIG. 7 further shows a photomask 702 applied to the insulator layer. This photomask 702 has openings 702a, which allow the exposure of portions of the lines 501. Openings 702a in photomask 702 are different from openings 302a in photomask 302. Openings 702a are intended to define the windows for forming copper bumps in contact with copper lines 501.

Figure 8A:
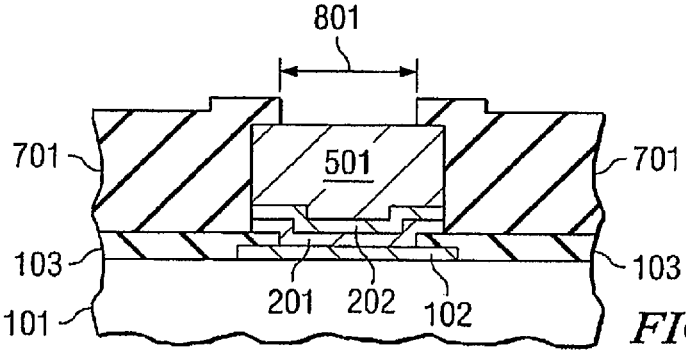
FIG. 8A is a schematic cross section of the wafer portion or FIG. 7 to depict the opening of a window in the insulation material to expose a portion of the lines.
Figure 8B:
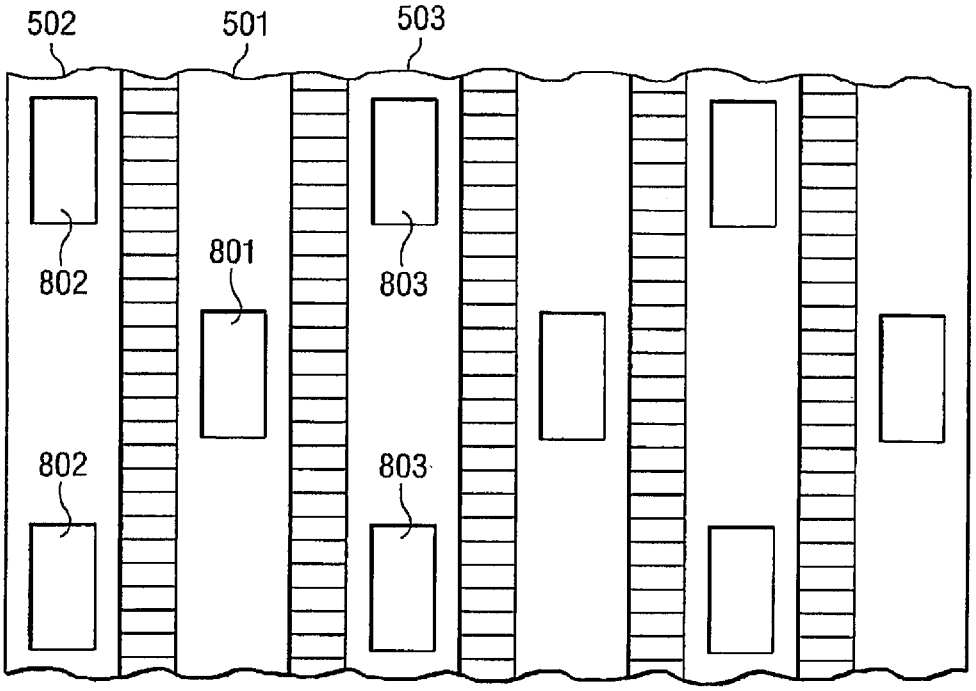
FIG. 8B is a schematic top view of the portion of patterned metallization traces of FIG. 6B as an example to illustrate the selection of the insulation window locations to be opened as shown in FIG. 8A; the insulation material is not shown.
Figure 8C:
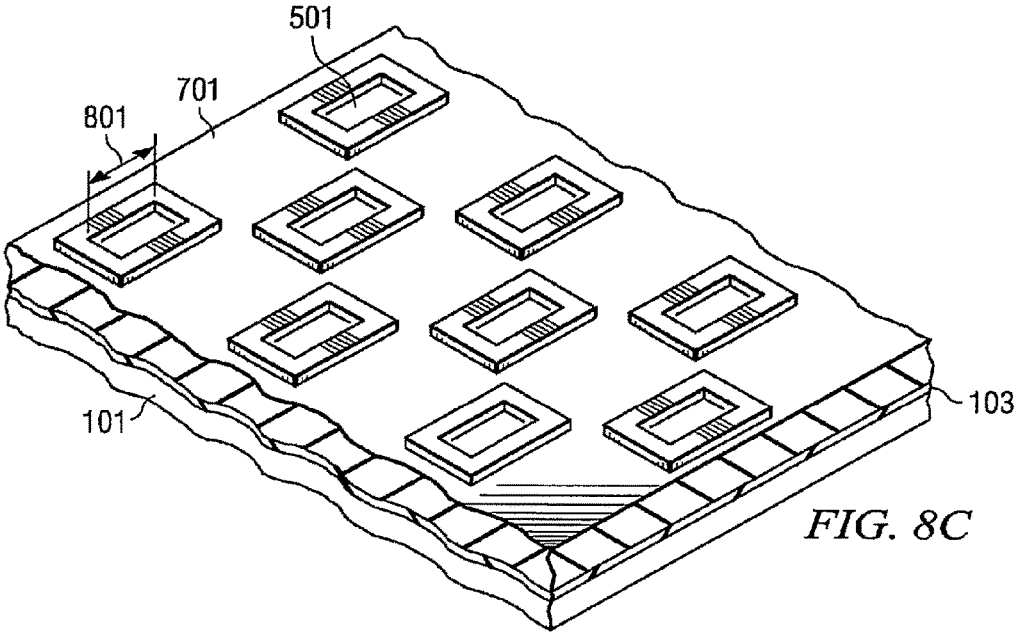
FIG. 8C is a schematic perspective view of the wafer portion of FIG. 8B to illustrate the selection of the insulation window locations; the insulation material is shown.

The locations of the windows 702a are selected in an orderly and repetitive arrangement on each line 501 so that the windows 702a of one line 501 are positioned about midway between the corresponding windows of the neighboring lines. FIG. 8A illustrates the development of the insulating layer 701, the opened windows 801 in the insulating layer 701, and the curing of the insulating material (polyimide). In perspective view, FIG. 8C indicates the opened windows 801 in the insulating layer 701. In FIG. 8B, representing an X-ray view from the top, the positioning of the windows 801 relative to the array of copper lines 501 highlights the orderly and repetitive arrangement: the windows 801 of one line 501 are positioned about midway between the corresponding windows 802, 803 of the neighboring lines 502, 503.

Figure 9:
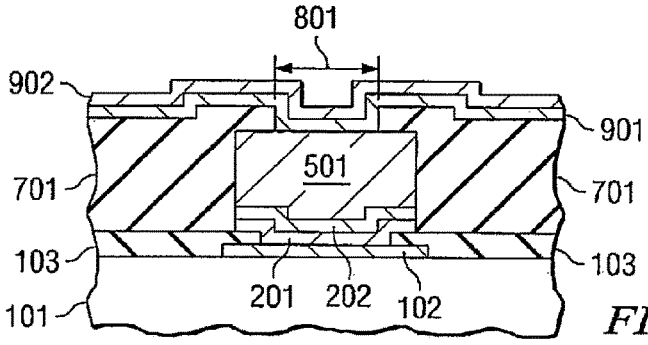

As FIG. 9 indicates, a couple of metal layers 901 and 902 are deposited over the wafer surface, including window 801; the preferred method of deposition is a sputtering technique. Layer 901 is a barrier metal such as titanium/tungsten alloy of approximately 0.5 μm thickness or less. Layer 902 is a seed metal layer, preferably copper, in the thickness range of about 0.5 to 0.8 μm. The stack of layers 901 and 902 is suitable to provide uniform potential for an electroplating step.

Figure 10:
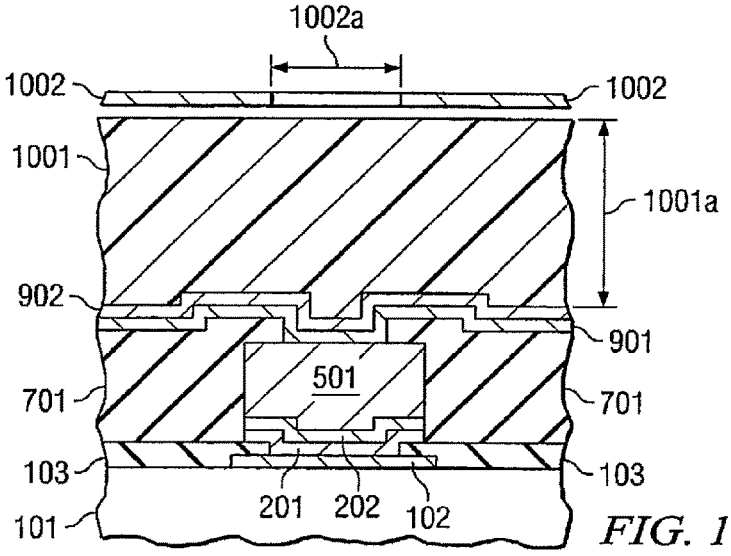

In FIG. 10, a second photoresist layer 1001 is deposited over seed metal layer 902 of the wafer. The thickness 1001a of the photoresist layer 1001 is selected so that it is commensurate with the intended height of the copper bumps, which will be fabricated using photoresist layer 1001. FIG. 10 further indicates the photomask 1002 with the opening 1002a for exposing the wafer under the mask. Photomask 1002 is different from photomasks 302 and 702; the openings 1002a define the length and width of the intended copper bumps.

Figure 11:
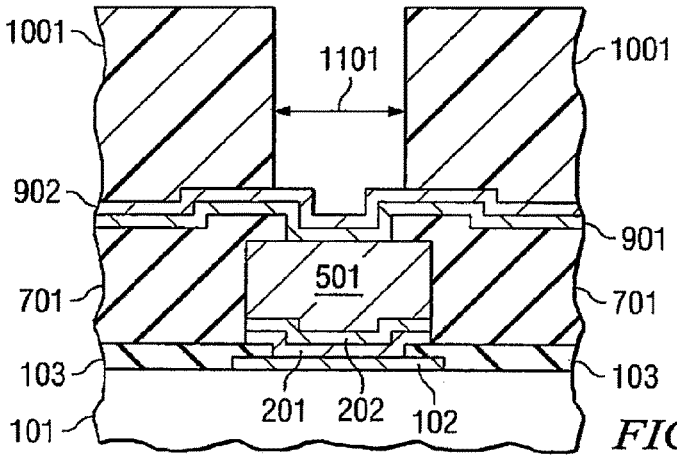
Figure 12:
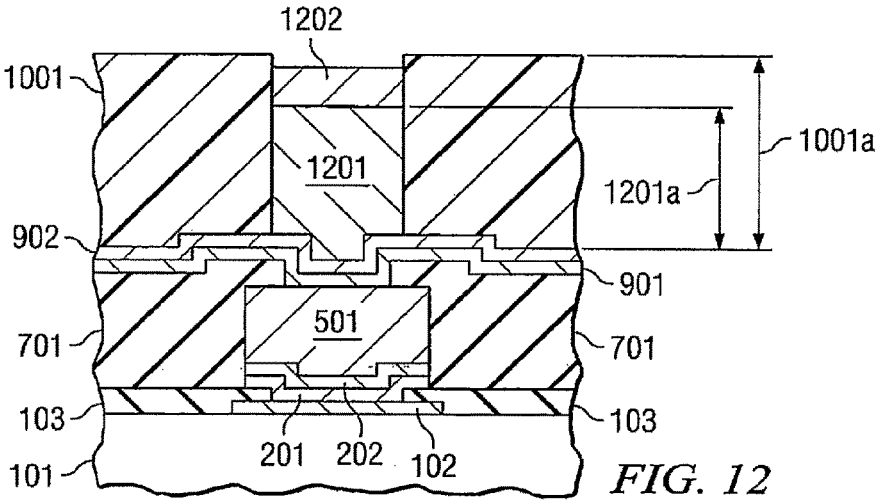

FIG. 11 illustrates the exposed and developed second photoresist layer 1001. A plurality of windows 1101 is opened in photoresist layer 1101, exposing a portion of seed layer 902. FIG. 12 shows the next process step, the deposition of copper bump 1201 in the window. Preferably using electroplating, copper or copper alloy is deposited in the photoresist window, creating copper bumps 1201 of height 1201a. Bump height 1201a may be equal to photoresist layer thickness 1001a, or alternatively it may be slightly less, as indicated in FIG. 12. In this case, one or more additional metal layers 1202 may be deposited (preferably by electroplating), which facilitate solder attachment. Examples of such metal layers are nickel, palladium, and gold; these layers are thin compared to the copper bump.

Figure 13A:
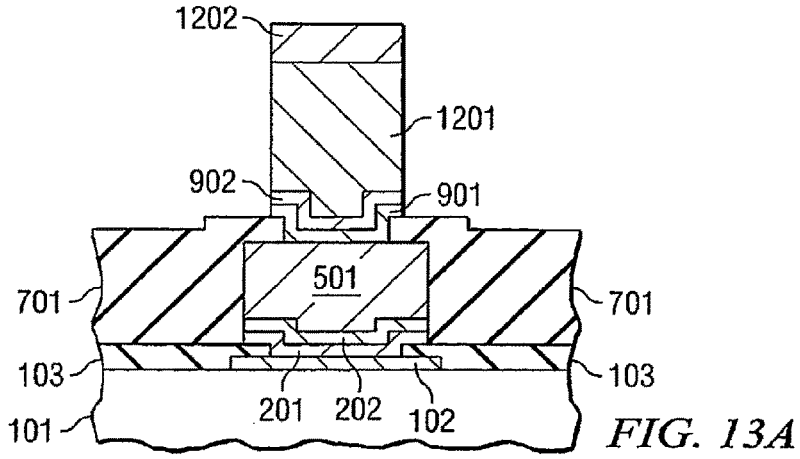
FIG. 13A is a schematic cross section of the wafer portion of FIG. 12 to depict the removal of the second photoresist layer, the barrier layer, and the seed layer.
Figure 13B:
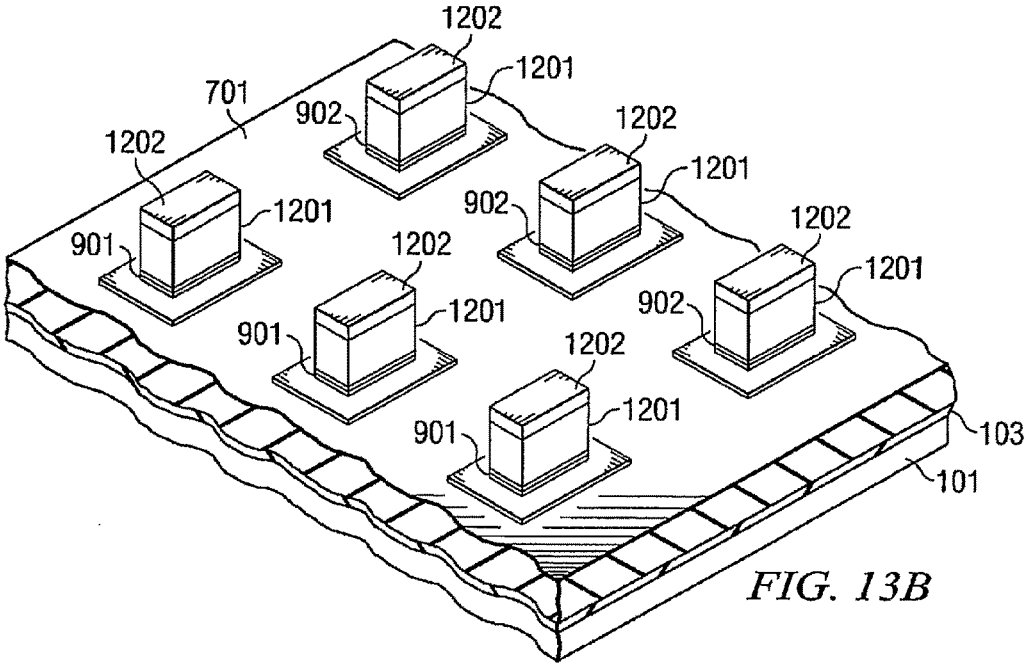
FIG. 13B is a schematic perspective view of the wafer portion of FIG. 8C to illustrate the deposited copper bumps in the selected insulation windows.

In the next process steps shown in FIG. 13A, the second photoresist layer is removed. Using the plated copper bump structure 1201 as an etch mask, the barrier (or adhesion) metal layer 901 and the seed metal layer 902 are subsequently etched off outside of copper bump 1201. A portion of the plurality of the plated copper bumps 1201 is shown in the perspective view of FIG. 13B. Each bump 1201 has a cap 1202 of at least one solderable metal layer, frequently with a tin palladium layer as the outermost layer.

The next process step is a singulation step, preferably involving a rotating diamond saw, by which the wafer is separated into individual chips. Each chip can then be further processed by assembling the chip onto a substrate or a leadframe.

In the next process step, a substrate is provided, which has elongated copper leads with first and second surfaces. A preferred example is a metallic leadframe with individual leads; preferred leadframe metals are copper or copper alloys, but in specific devices, iron/nickel alloys or aluminum may be used. Other examples include insulating substrates with elongated copper leads. The leads are oriented at right angles to the copper lines 501 shown in FIGS. 6A to 6C. The first surface of each lead is then connected to the corresponding bumps of alternating lines using solder elements. This assembly is schematically illustrated in FIGS. 14A and 14B.

Figure 14A:
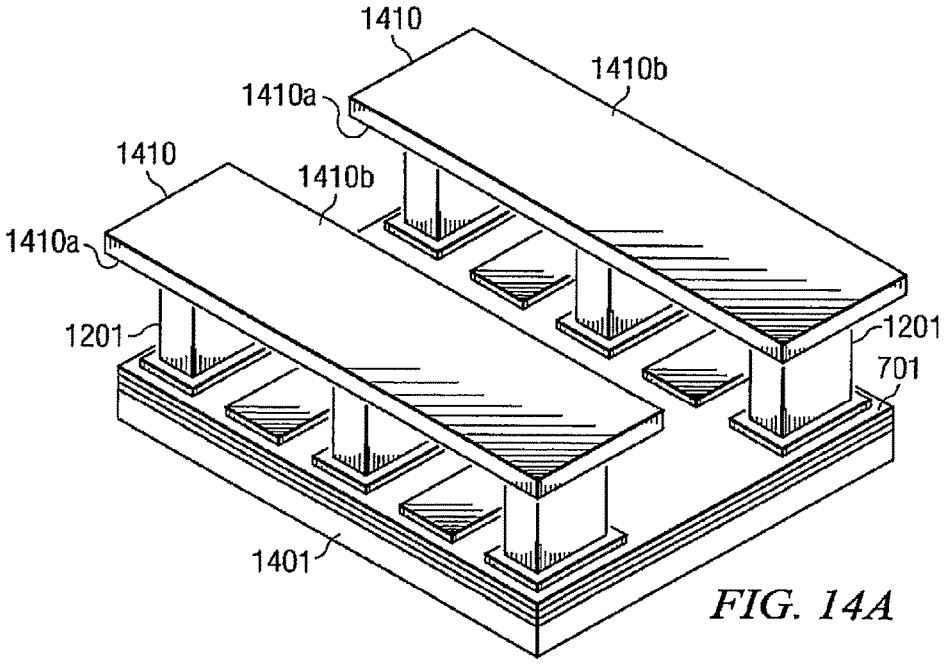
FIG. 14A is a schematic perspective view of the wafer portion of FIG. 13B to illustrate the assembly of the copper bumps to substrate leads.

In FIG. 14A, chip 1401 is covered by insulation material 701 and has a plurality of copper bumps 1201. The first surfaces 1410a of substrate copper leads 1410 are shown to be attached to copper bumps 1201 (not shown in FIG. 14A are copper lines 501 on the chip surface; leads 1410 are at right angles to lines 501). The second surfaces 1410b of leads 1410 are faced away from bumps 1201.

Figure 14B:
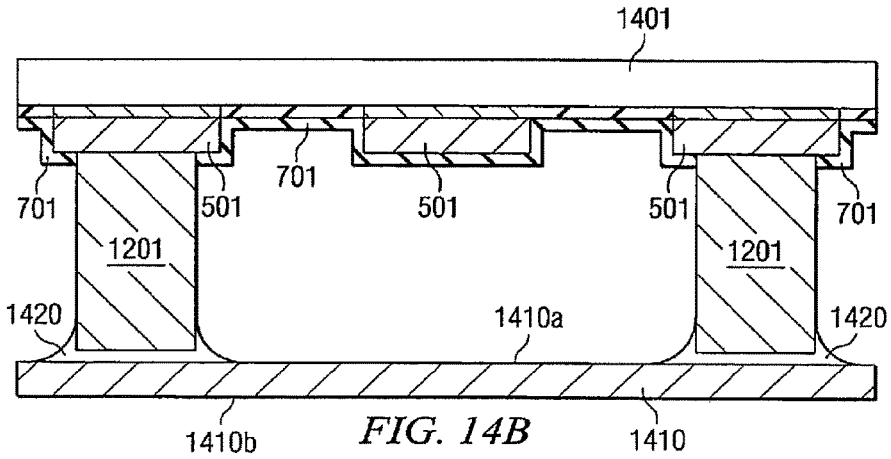
FIG. 14B is a schematic cross section of the flipped assembly of FIG. 14A.

Flipping the assembly of FIG. 14A produces the orientation of FIG. 14B, which displays a cross section of the chip-on-substrate assembly. Chip 1401 has copper lines 501 covered by insulation material 701. On alternating lines, copper bumps 1201 are shown, which are attached by solder elements 1420 to the first surface 1410a of lead 1410. Even if solder elements 1420 should creep along the complete surfaces of bumps 1201, insulation material 701 prevents an electrical shortening to neighboring conductors.

Figure 15:
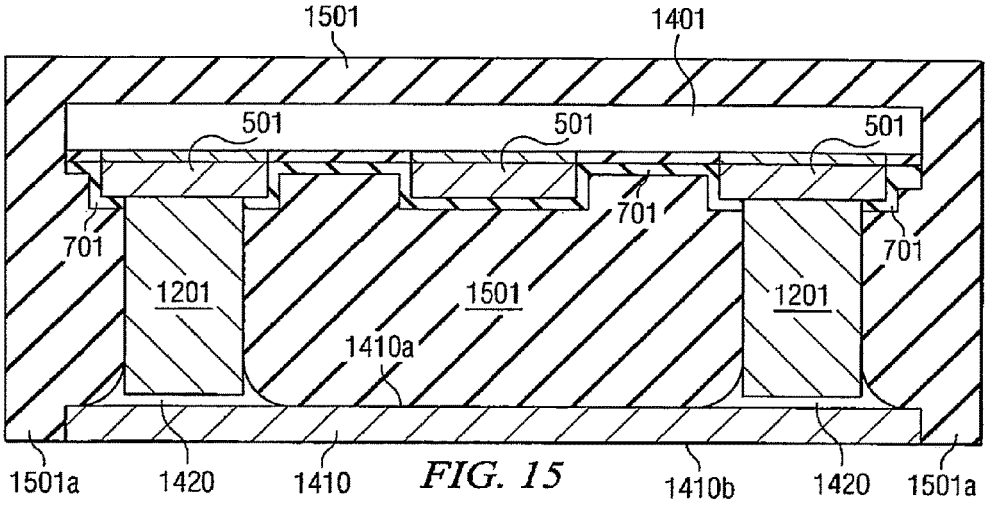

The assembly of FIGS. 14A/14B is submitted to a block mold, in which a plurality of assembled units is encapsulated in a batch molding process. The second lead surfaces 1410b remain un-encapsulated and exposed for further attachment, for instance solder layers to a circuit board. A saw is finally employed to separate the individual product units. FIG. 15 illustrates such singulated device encapsulated in molding compound 1501. The side walls 1501a of the device are straight, since they have been created by the sawing process.

From lead surface 1410b to the chip circuitry, there is a continuous electrical path through copper connectors (with the exception of solder element 1420). Consequently, the electrical resistance and the electrical inductance of the device displayed in FIG. 15 are low. The device of FIG. 15 is thus suitable for high current (30 A and higher) applications. This characteristic can be further exploited by pressing or soldering second lead surfaces 1410b to a circuit board, which has copper contact pads parallel to leads 1410 and matching their number and position. The preferred method of attachment is soldering by using solder layers.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the substrate may be an insulating tape with copper leads of first and second surfaces. As another example, the copper bumps may be considerably shorter than illustrated in the figures; there still will be no risk of electrical shorts by creeping solder elements. It is therefore intended that the appended claims encompass any such modifications.

We claim:

[1. A method for fabricating a low resistance, low inductance interconnection structure for high current semiconductor flip-chip products, comprising the steps of:

providing a semiconductor wafer having metallization traces, the wafer surface protected by an overcoat, and windows in the overcoat to expose portions of the metallization traces;

forming copper lines on the overcoat, contacting the traces by filling the windows with metal;

depositing a layer of photo-imageable insulation material over the lines and the remaining wafer surface;

opening windows in the insulation material to expose portions of the lines, the locations of the windows selected in an orderly and repetitive arrangement on each line so that the windows of one line are positioned about midway between the corresponding windows of the neighboring lines; and forming copper bumps in the windows, in contact with the lines.]

[2. The method according to claim 1 further comprising the step of depositing a cap of solderable metal layers on each bump.]

[3. The method according to claim 1 wherein the number and locations of the windows in the overcoat are selected as needed for the devices employing the metallization traces.]

[4. The method according to claim 1 wherein the copper lines are oriented parallel to the metallization traces.]

[5. The method according to claim 1 wherein the copper lines are oriented at right angles to the metallization traces.]

[6. The method according to claim 1 wherein the step of forming copper lines comprises the steps of:

depositing a barrier metal layer over the wafer surface;

depositing a seed metal layer over the barrier metal layer;

depositing a first photoresist layer over the seed metal layer in a height commensurate with the height of intended copper lines;

opening windows in the photoresist layer so that the windows are shaped as the intended lines;

depositing copper to fill the photoresist windows and form copper lines;

removing the first photoresist layer; and removing the portions of the adhesion and barrier layers, which are exposed after removing the first photoresist layer.]

[7. The method according to claim 6, wherein the step of depositing copper comprises an electroplating technique.]

[8. The method according to claim 1 wherein the step of forming copper bumps comprises the steps of:

depositing a barrier metal layer over the wafer surface;

depositing a seed metal layer over the barrier metal layer;

depositing a second photoresist layer over the seed metal layer in a height commensurate with the height of the intended copper bumps;

opening windows in the photoresist layer in locations intended for copper bumps, and of a width commensurate with the width of the intended copper bumps;

filling the photoresist windows by depositing copper to form copper bumps;

removing the second photoresist layer; and removing the portions of the adhesion and barrier layers, which are exposed after removing the second photoresist layer.]

[9. The method according the step 8, wherein the step of depositing copper comprises an electroplating technique.]

[10. The method according to claim 8 further comprising the step of:

depositing one or more solderable metal layers on the surface of the copper bump, before removing the second photoresist layer.]

[11. The method according to claim 10 wherein said solderable metal layers include a layer of nickel on the copper surface, followed by a layer of palladium on the nickel layer.]

[12. A method for fabricating a low resistance, low inductance interconnection device for high current semiconductor flip-chip products, comprising the steps of:

providing a structure comprising a semiconductor chip having metallization traces, copper lines in contact with the traces, and copper bumps located in an orderly and repetitive arrangement on each line so that the bumps of one line are positioned about midway between the corresponding bumps of the neighboring lines;

providing a substrate having elongated copper leads with first and second surfaces, the leads oriented at right angles to the lines;

connecting the first surface of each lead to the corresponding bumps of alternating lines using solder elements; and encapsulating the assembly in molding compound so that the second lead surfaces remain un-encapsulated.]

[13. The method according to claim 12 wherein the substrate is a leadframe including copper.]

[14. A method for fabricating a low resistance, low inductance interconnection system for high current semiconductor flip-chip devices, comprising the steps of:

providing a low resistance, low inductance interconnection device comprising:

a semiconductor chip structure including copper lines in contact with chip metallization traces, and copper bumps located in an orderly and repetitive arrangement on each line, the bumps of one line positioned about midway between the corresponding bumps of the neighboring lines;

a substrate having elongated copper leads with first and second surfaces, the leads at right angles to the lines, the first lead surfaces connected to the corresponding bumps of alternating lines by solder elements; and the chip structure and substrate encapsulated so that the second lead surfaces remain un-encapsulated;

providing a circuit board having copper contact pads parallel to the leads; and attaching the second surface of the device leads to the board pads using solder layers.]

*15. A method comprising:*

*providing a structure having:*

*a semiconductor chip having metallization traces;*

*copper lines in contact with the traces; and*

*copper bumps located in an orderly and repetitive arrangement on each line so that the bumps of one line are positioned about midway between the corresponding bumps of the neighboring lines;*

*providing a substrate having elongated copper leads with first and second surfaces, each lead oriented at a right angle to the lines;*

*connecting the first surface of each lead to the corresponding bumps of alternating lines using solder elements; and*

*encapsulating portions of the structure and the substrate, wherein the second surface of each of the leads is un-encapsulated.*

*16. The method according to claim 15 wherein the substrate is a leadframe including copper.*

*17. A method comprising:*

*forming a plurality of metallization traces on a first substrate, wherein the metallization traces are generally in parallel to one another;*

*forming a plurality of conductive lines on the first substrate, wherein each conductive line is in contact with and is at least partially coextensive with at least one of the metallization traces;*

*forming a plurality of conductive bumps on each of the conductive lines, wherein the conductive bumps for each line are arranged in an orderly and repetitive pattern such that each conductive bump is positioned about midway between the corresponding conductive bumps of each of its neighboring conductive lines;*

*forming a plurality of leads on a second substrate, wherein each lead includes a first surface and an opposite second surface;*

*electrically connecting the first surface of each of the plurality of leads to corresponding conductive bumps from alternating conductive lines on the first substrate, wherein each lead is oriented at an angle to each conductive line; and*

*forming an encapsulation layer over portions of the first substrate and the second substrate, wherein the second surface of each of the of the leads is not covered by the encapsulation layer.*

*18. The method according to claim 17 wherein the conductive lines, the conductive bumps, and the leads further comprise copper.*

*19. The method according to claim 18, wherein the angle is a right angle.*

*20. The method according to claim 19 wherein the step of forming a plurality of conductive lines further comprises the steps of:*

*depositing a barrier metal layer over a surface of the substrate;*

*depositing a seed metal layer over the barrier metal layer;*

*depositing a first photoresist layer over the seed metal layer in a height commensurate with the height of intended copper lines;*

*opening windows in the photoresist layer so that the windows are shaped as the intended lines;*

*depositing copper to fill the photoresist windows;*

*removing the first photoresist layer; and*

*removing the portions of the adhesion and barrier layers, which are exposed after removing the first photoresist layer.*

*21. The method according to claim 20, wherein the step of depositing copper comprises an electroplating technique.*

*22. The method according to claim 19 wherein the step of forming the plurality of conductive bumps further comprises the steps of:*

*depositing a barrier metal layer over the substrate;*

*depositing a seed metal layer over the barrier metal layer;*

*depositing a second photoresist layer over the seed metal layer in a height commensurate with the height of the intended conductive bumps;*

*opening windows in the photoresist layer in locations intended for conductive bumps, and of a width commensurate with the width of the intended conductive bumps;*

*filling the photoresist windows by depositing conductive to form conductive bumps; removing the second photoresist layer; and*

*removing the portions of the adhesion and barrier layers, which are exposed after removing the second photoresist layer.*

*23. The method according the claim 22 wherein the step of depositing copper comprises an electroplating technique.*

*24. The method according to claim 23 further comprising the step of depositing a solderable metal layer on the surface of the copper bump, before removing the second photoresist layer.*

*25. The method according to claim 24 wherein the solderable metal layer includes a layer of nickel on the copper surface, followed by a layer of palladium on the nickel layer.*

*26. The method according to claim 19 wherein the first substrate is formed from a semiconductor wafer.*

*27. The method according to claim 26 wherein the second substrate is a leadframe.*

*28. The method according to claim 17 wherein the first substrate is formed from a semiconductor wafer.*

*29. The method according to claim 28 wherein the second substrate is a leadframe.*

*30. The method according to claim 17 wherein the step of electrically connecting further comprises soldering the first surface of each of a plurality of leads to corresponding conductive bumps from alternating conductive lines on the first substrate.*

* * * * *